United States Patent
Smayling et al.

(10) Patent No.: US 7,939,898 B2
(45) Date of Patent: May 10, 2011

(54) DIFFUSION VARIABILITY CONTROL AND TRANSISTOR DEVICE SIZING USING THRESHOLD VOLTAGE IMPLANT

(75) Inventors: Michael C. Smayling, Fremont, CA (US); Scott T. Becker, Scotts Valley, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 423 days.

(21) Appl. No.: 12/271,907

(22) Filed: Nov. 16, 2008

(65) Prior Publication Data

US 2009/0127636 A1    May 21, 2009

Related U.S. Application Data

(60) Provisional application No. 60/988,762, filed on Nov. 16, 2007.

(51) Int. Cl.
*H01L 29/76* (2006.01)
*H01L 29/94* (2006.01)

(52) U.S. Cl. ............... 257/391; 257/392; 257/E21.443; 438/217; 438/289

(58) Field of Classification Search ............ 257/391, 257/392, E21.443; 438/217, 289
See application file for complete search history.

(56) References Cited

U.S. PATENT DOCUMENTS

| | | | | |
|---|---|---|---|---|
| 4,354,307 A * | 10/1982 | Vinson et al. | ............... | 438/143 |
| 4,906,587 A * | 3/1990 | Blake | ............... | 438/151 |
| 5,478,763 A * | 12/1995 | Hong | ............... | 438/286 |
| 5,985,705 A * | 11/1999 | Seliskar | ............... | 438/197 |
| 6,482,714 B1 * | 11/2002 | Hieda et al. | ............... | 438/416 |
| 6,597,035 B1 * | 7/2003 | Harris | ............... | 257/315 |
| 7,227,239 B2 * | 6/2007 | Abadeer et al. | ............... | 257/529 |
| 7,645,662 B2 * | 1/2010 | Min | ............... | 438/217 |
| 2003/0047763 A1 * | 3/2003 | Hieda et al. | ............... | 257/288 |
| 2003/0173622 A1 * | 9/2003 | Porter et al. | ............... | 257/355 |
| 2006/0038238 A1 * | 2/2006 | Lotfi et al. | ............... | 257/369 |
| 2006/0060938 A1 * | 3/2006 | Abadeer et al. | ............... | 257/529 |
| 2006/0267044 A1 * | 11/2006 | Yang | ............... | 257/141 |

\* cited by examiner

*Primary Examiner* — Ngan Ngo
(74) *Attorney, Agent, or Firm* — Martine Penilla & Gencarella, LLP (57) ABSTRACT

A transistor is defined to include a substrate portion and a diffusion region defined in the substrate portion so as to provide an operable transistor threshold voltage. An implant region is defined within a portion of the diffusion region so as to transform the operable transistor threshold voltage of the diffusion region portion into an inoperably high transistor threshold voltage. A gate electrode is defined to extend over both the diffusion region and the implant region. A first portion of the gate electrode defined over the diffusion region forms a first transistor segment having the operable transistor threshold voltage. A second portion of the gate electrode defined over the implant region forms a second transistor segment having the inoperably high transistor threshold voltage. Therefore, a boundary of the implant region defines a boundary of the operable first transistor segment.

26 Claims, 10 Drawing Sheets

DIFFUSION VARIABILITY CONTROL AND TRANSISTOR DEVICE SIZING USING THRESHOLD VOLTAGE IMPLANT

CLAIM OF PRIORITY

This application claims priority under 35 U.S.C. 119(e) to U.S. Provisional Patent Application No. 60/988,762, filed Nov. 16, 2007, entitled "Diffusion Variability Control and Transistor Device Sizing Using HVT I/O Implant." The disclosure of the above-identified provisional patent application is incorporated herein by reference.

BACKGROUND

Figure 1:
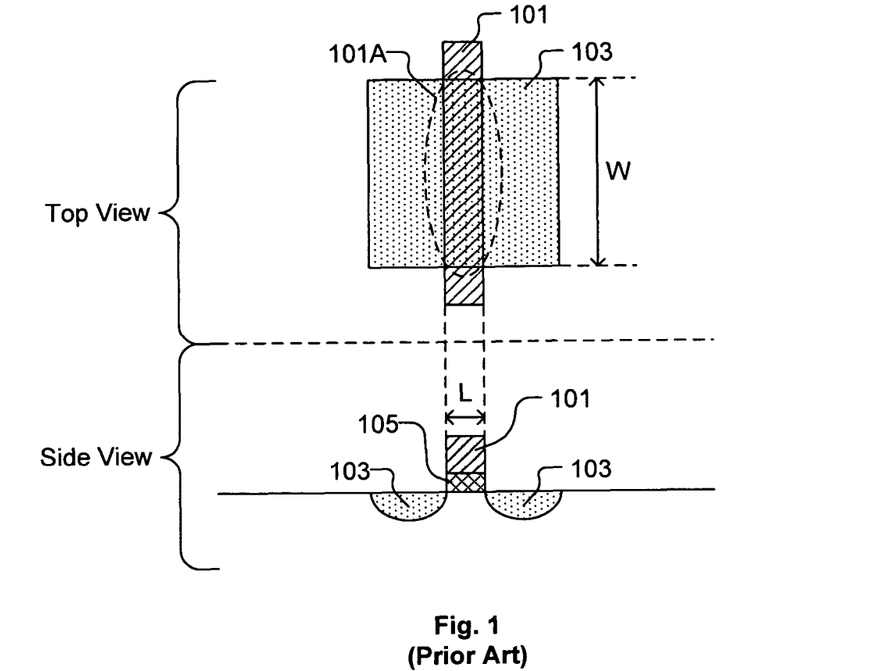
FIG. 1 shows an idealized CMOS layout for a transistor.

FIG. 1 shows an idealized CMOS layout for a transistor 101A. The transistor 101A includes a doped diffusion region 103, which is either p-type or n-type to form source and drain regions of the transistor 101A. The transistor 101A also includes a poly silicon layer used for a gate electrode 101. Additionally, an insulator 105 is deposited to separate the gate electrode 101 from the diffusion region 103. In general, semiconductor device designers control the characteristics of the transistor 101A by varying its dimensions. The dimensions of the transistor 101A are defined by a channel width (W) and a channel length (L). The channel width (W) is defined by the size of the diffusion region 103. The channel length (L) is defined by a size of the gate electrode 101 in the direction extending between the source and drain regions. The channel width (W) is varied to optimize the drive current of the transistor 101A. The channel length (L) is typically defined as small as possible within the limitations of the manufacturing process.

Figure 2:
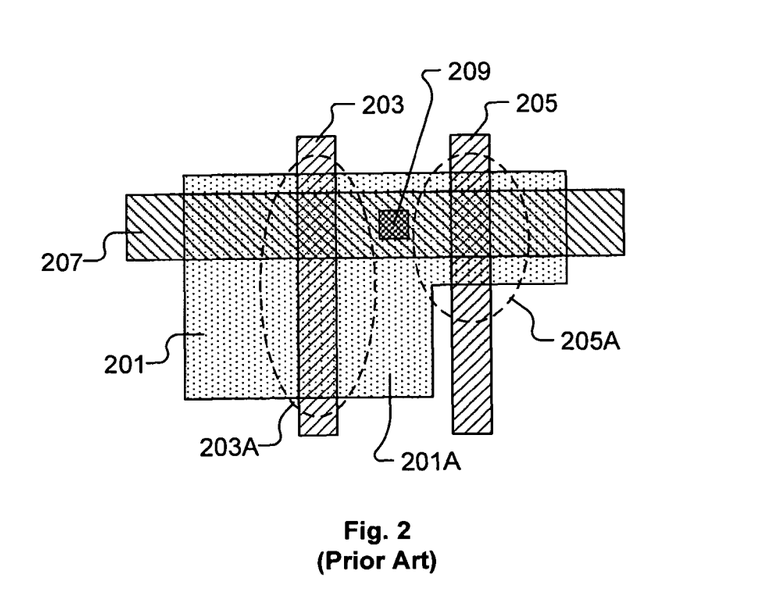
FIG. 2 shows two exemplary transistors which have different channel widths, and which share a common diffusion node.

FIG. 2 shows two exemplary transistors 203A and 205A which have different channel widths, and which share a common diffusion node 201A. Transistor 203A is formed by an intersection of its gate electrode 203 and a diffusion region 201. Transistor 205A is formed by an intersection of its gate electrode 205 and the diffusion region 201. The common diffusion node 201A is coupled to a higher level interconnect conductor 207 (e.g., metal 1 line) by way of contact 209. It should be understood that the sharp-cornered periphery of the diffusion region 201 is shown in an idealized manner. In reality, an ability to resolve corners of layout shapes, such as those associated with diffusion region 201, decreases dramatically as the resolution of the lithography process decreases.

Figure 3:
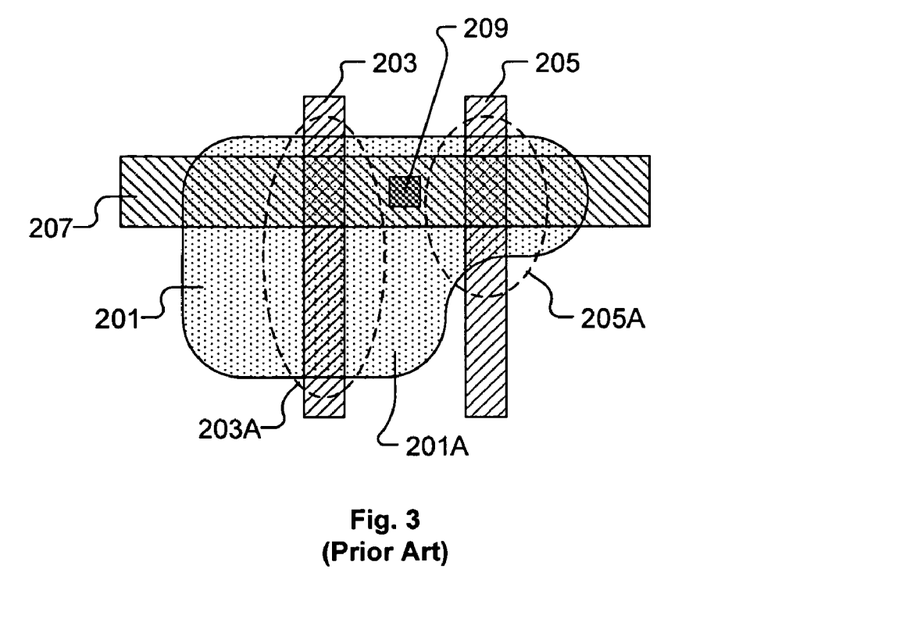
FIG. 3 shows a more realistic representation of the as-fabricated diffusion region.

FIG. 3 shows a more realistic representation of the as-fabricated diffusion region 201. As shown in FIG. 3, limitations on the resolution of the lithography process causes the corners of the as-fabricated diffusion region 201 to be rounded. For example, at 45 and 32 nanometer (nm) process nodes, sharp corners such as those of diffusion region 201 are well outside of the resolution capability of conventional lithography systems. It should be appreciated that lithography-induced curvature in a diffusion region boundary that extends beneath a gate electrode can cause unacceptable variability in a channel width of the transistor formed by the gate electrode. And, such unacceptable variability in the channel width of the transistor may cause an unacceptable performance of the transistor. An extent of transistor channel width variability due to lithography-induced curvature at diffusion region bend locations depends upon the proximity of the bend locations to the gate electrode, and any misalignment between the gate electrode mask and the diffusion layer, and possibly other processing effects. It is also worth noting that shallow trench isolation (STI) strain, strain layer variation, and other proximity and shape related effects are also dependent upon the as-fabricated diffusion region shape.

Figure 4:
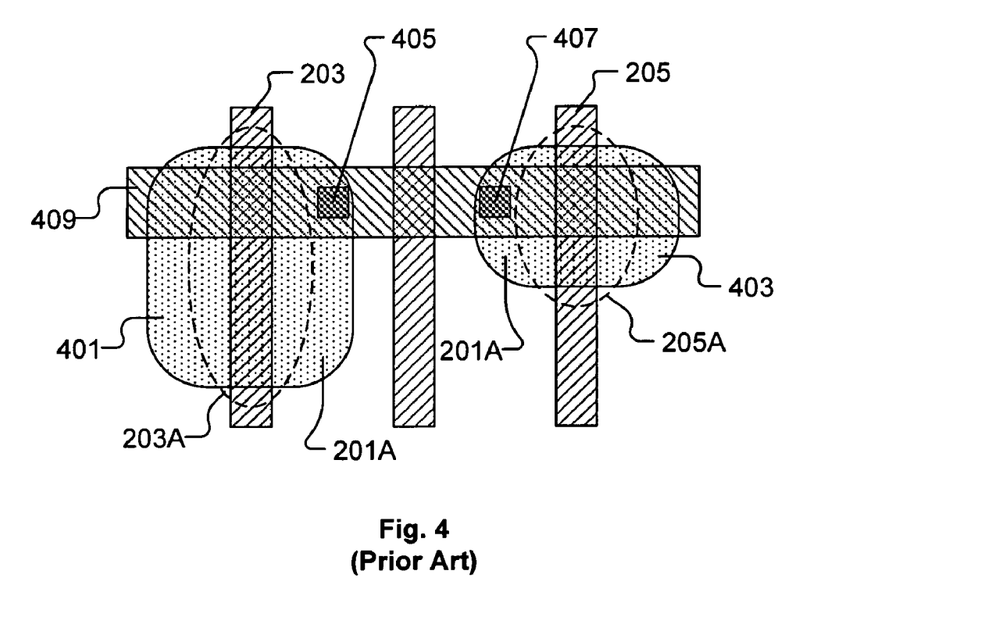
FIG. 4 shows a modification of the transistor layout of FIG. 3.

One approach for mitigating the effects of lithography-induced curvature in diffusion region boundaries is to separate transistors that share a common node, such that each bend in the diffusion region boundary associated with a given transistor can be moved sufficiently far away from the gate electrode of the given transistor so as to maintain a substantially straight as-fabricated diffusion region boundary beneath the gate electrode of the given transistor. FIG. 4 shows an example application of this approach to define transistors 203A and 205A of FIG. 3. The transistors 203A and 205A are separated and are defined by respective diffusion regions 401 and 403. The separation of transistors 203A and 205A allows the as-fabricated boundaries of diffusion regions 401 and 403 to be straight at the locations beneath gate electrodes 203 and 205, respectively. The shared diffusion node 201A is connected by way of contacts 405 and 407 and higher-level interconnect conductor 409.

It should be understood, however, that separation of transistors that share a common node can be non-optimal. For example, separation of transistors 203A and 205A as shown FIG. 4 results in an increased usage of chip area to define the transistors 203A and 205A. In modern semiconductor devices, chip area is at a premium and such increased chip area usage is undesirable. Also, separation of transistors 203A and 205A as shown FIG. 4 results in an increased capacitance on the shared diffusion node 201A, which can negatively impact the performance of transistors 203A and 205A.

Figure 5:
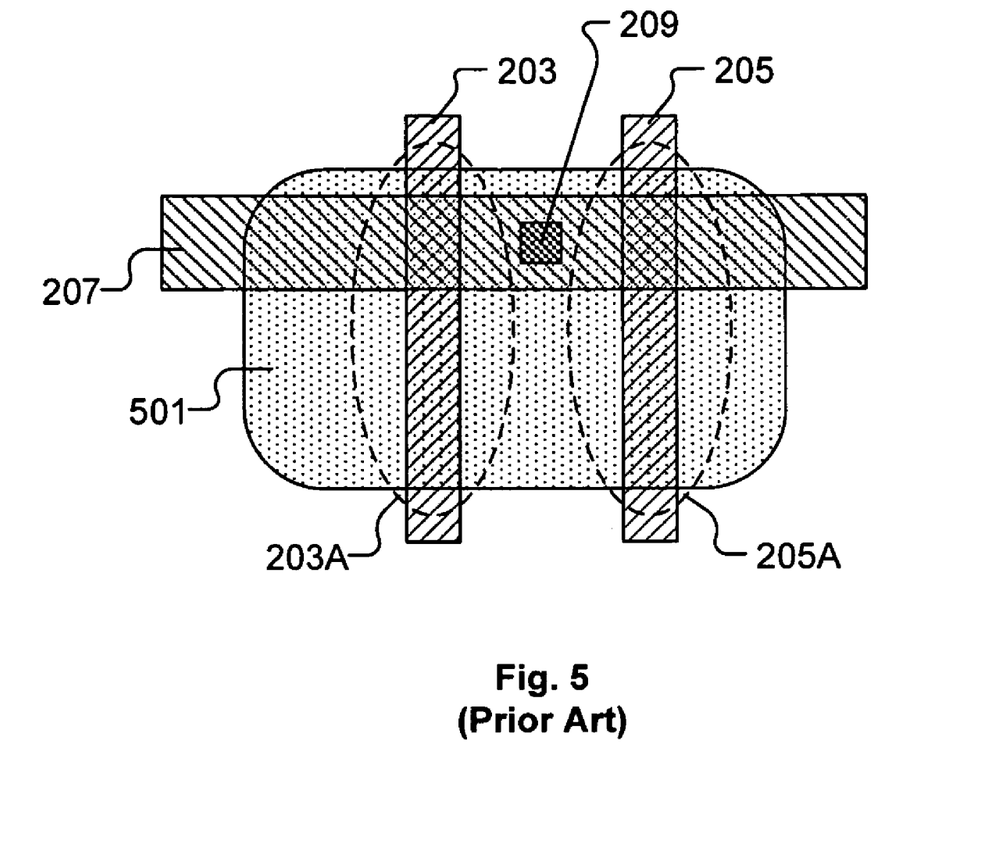
FIG. 5 shows another modification of the transistor layout of FIG. 3.

Another approach for mitigating the effects of lithography-induced curvature in diffusion region boundaries requires that transistors be forced to have a same channel width, even when not required for adequate and/or optimal circuit performance. FIG. 5 shows an example application of this approach to define the transistors 203A and 205A of FIG. 3. As shown in FIG. 5, the diffusion region 501 is now defined such that both of transistors 203A and 205A have a common channel width. However, forcing transistors to a common channel width when neither necessary nor optimal can be detrimental to circuit performance. For example, increasing the channel width of transistor 205A over its width as required to meet design constraints causes an increase in leakage and active power consumption of the circuit. Moreover, increasing the channel width of transistors beyond what is necessary can have a negative impact on chip area utilization, because larger drivers may then be required for the oversized transistors.

SUMMARY

In one embodiment, a transistor is disclosed to include a substrate portion and a diffusion region defined in the substrate portion. The diffusion region is defined to provide an operable transistor threshold voltage. An implant region is defined within a portion of the diffusion region so as to transform the operable transistor threshold voltage of the portion of the diffusion region into an inoperably high transistor threshold voltage. A gate electrode is defined to extend over both the diffusion region and the implant region. A first portion of the gate electrode defined over the diffusion region forms a first transistor segment having the operable transistor threshold voltage. A second portion of the gate electrode defined over the implant region forms a second transistor segment having the inoperably high transistor threshold voltage.

In another embodiment, a method is disclosed for designing a transistor. The method includes an operation for specifying a diffusion region to be defined within a substrate so as to provide an operable transistor threshold voltage in the diffusion region. The method also includes an operation for specifying an implant region within a portion of the diffusion region. The implant region is specified to transform the operable transistor threshold voltage of the portion of the diffusion region into an inoperably high transistor threshold voltage. The method further includes an operation for specifying a gate electrode to extend over both the diffusion region and the implant region. A first portion of the gate electrode defined over the diffusion region forms a first transistor segment having the operable threshold voltage. A second portion of the gate electrode defined over the implant region forms a second transistor segment having the inoperably high transistor threshold voltage.

In another embodiment, a semiconductor fabrication process is disclosed. The process includes forming a diffusion region in a substrate so as to provide an operable transistor threshold voltage. The process also includes forming an implant region over a portion of the diffusion region. The implant region includes a dopant concentration sufficiently high so as to transform the operable transistor threshold voltage of the diffusion region portion into an inoperably high transistor threshold voltage. The process further includes forming a gate electrode to extend over both the diffusion region and the implant region. A first portion of the gate electrode defined over the diffusion region forms a first transistor segment having the operable transistor threshold voltage. A second portion of the gate electrode defined over the implant region forms a second transistor segment having the inoperably high transistor threshold voltage.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 6:
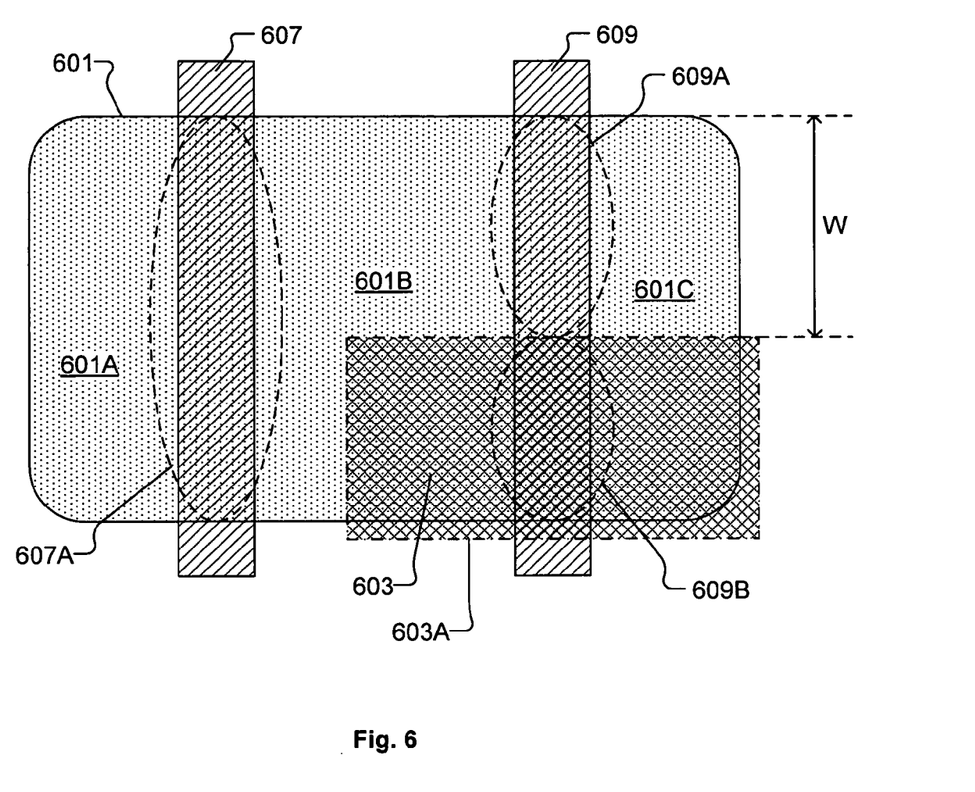
FIG. 6 is an illustration showing use of an implant region to adjust effective diffusion region boundaries in defining a transistor, in accordance with one embodiment of the present invention.

FIG. 6 is an illustration showing use of an implant region to adjust effective diffusion region boundaries in defining a transistor, in accordance with one embodiment of the present invention. A diffusion region 601 is defined in a substrate portion. In an exemplary embodiment, the substrate portion is defined as a portion of a silicon substrate of a semiconductor chip. Also, in an exemplary embodiment, the diffusion region 601 is defined as a doped region (e.g., n-type, p-type) of the substrate portion within which transistor source/drain regions 601A-601C are formed. In one embodiment, regions 601A and 601C represent source regions, and the region 601B represents a drain region. In another embodiment, regions 601A and 601C represent drain regions, and the region 601B represents a source region. Also, in the example of FIG. 6, the diffusion region 601 is formed based on a rectangular-shaped layout area for the diffusion region 601. Use of the rectangular-shaped layout area for the diffusion region 601 optimizes a predictability of a strain impact or other processing effects.

A gate electrode 607 is defined over the diffusion region 601. An interface between the gate electrode 607 and the diffusion region 601 forms a transistor 607A based on source/drain regions 601A and 601B. The diffusion region 601 and source/drain regions 601A-601C therein are defined to provide an operable transistor threshold voltage. Therefore, a normal operating voltage associated with the gate electrode 607 will be greater than the operable threshold voltage provided by the diffusion region 601, such that the transistor 607A will function under normal operating conditions.

An implant region 603 is defined over a portion of the diffusion region 601. The implant region 603 is defined such that a dopant concentration within the implant region 603 is modified to a point at which a normal operating voltage associated with a transistor segment defined over the implant region 603 will not be sufficient to activate the transistor segment, thereby rendering the transistor segment over the implant region 603 inoperable. Therefore, the implant region 603 is defined within a portion of the diffusion region 601 so as to transform the operable transistor threshold voltage of the portion of the diffusion region into an inoperably high transistor threshold voltage. Thus, a normal operating voltage associated with the gate electrode that forms the transistor segment over the implant region 603 will be less than the inoperably high transistor threshold voltage of the implant region 603, such that the transistor segment over the implant region 603 is rendered inoperable under normal operating conditions.

Figure 10:
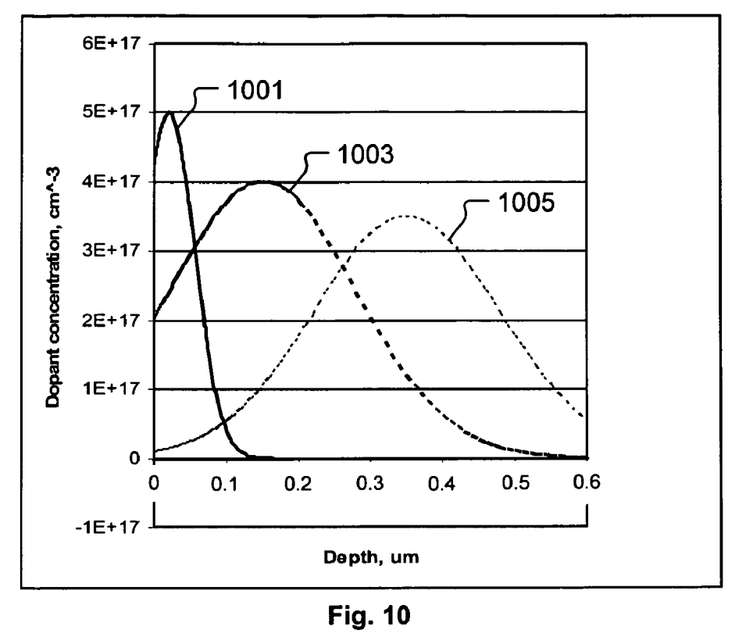
FIG. 10 shows an example of dopant concentration profiles that may exist within a channel region of a transistor defined over the diffusion region, in accordance with one embodiment of the present invention.

FIG. 10 shows an example of dopant concentration profiles that may exist within a channel region of a transistor defined over the diffusion region 601, in accordance with one embodiment of the present invention. The exemplary dopant concentration profiles include contributions from a threshold voltage adjustment implant process (shown by curve 1001), a punch-through implant process (shown by curve 1003), and a well implant process (shown by curve 1005). It should be appreciated that a shallow depth of the threshold voltage adjustment implant process contributes linearly to the transistor threshold voltage.

Figure 11:
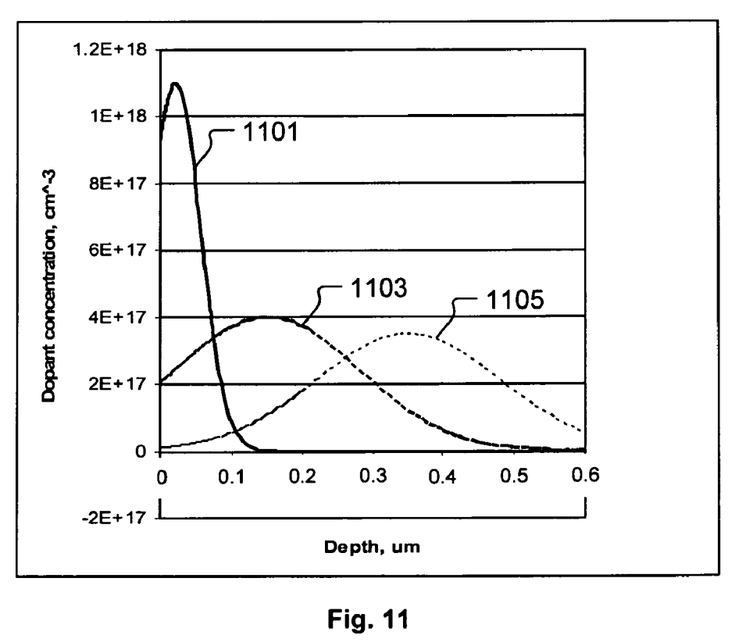
FIG. 11 shows an example of dopant concentration profiles that may exist within a channel region of a transistor defined over the implant region, in accordance with one embodiment of the present invention.

FIG. 11 shows an example of dopant concentration profiles that may exist within a channel region of a transistor defined over the implant region 603, in accordance with one embodiment of the present invention. The threshold voltage adjustment implant process is shown by curve 1101. The punch-through implant process is shown by curve 1103. The well implant process is shown by curve 1105. The punch-through implant process curve 1103 and well implant process curve 1105 of the implant region 603 are the same as the corresponding curves 1003 and 1005, respectively, of the diffusion region 601, as shown in FIG. 10. However, the threshold voltage adjustment implant process curve 1101 of the implant region 603 is significantly greater than the corresponding curve 1001, as shown in FIG. 10. Therefore, the transistor threshold voltage associated with the implant region 603 is significantly greater than that associated with the diffusion region 601. It should be understood that the implant process curves of FIGS. 10 and 11 are provided by way of example, and will vary depending on the technology node and device requirements.

In various embodiments, the implant region 603 can be defined using any of a number of different dopant implant processes. For example, the implant region 603 may be defined using dopant implant processes such as ion implantation. In one embodiment, the implant region 603 may be defined during a separate fabrication process specifically for implant region 603 formation. However, in another embodiment, formation of the implant region 603 may be done in conjunction with an existing fabrication process, thereby avoiding significant increase in fabrication time and cost.

For example, a high voltage transistor implant process may be performed to define input/output buffers of a circuit. In one embodiment, the implant region 603 may be formed in conjunction with the already prescribed high voltage transistor implant process by including the implant region 603 on the mask to be used for the high voltage transistor implant process. In this embodiment, the implant region 603 may be defined consistent with the high voltage implant regions of the input/output buffers. For example, in one embodiment, the implant region 603 and the high voltage implant regions of the input/output buffers can be defined to provide a transistor threshold voltage of at least 2.5 volts. While the high voltage implant regions of the input/output buffers provide an operable transistor threshold voltage for the input/output buffers under their normal operating conditions, use of the high voltage implant region specifications to define the implant region 603 will cause the transistor segment over the implant region 603 to have an inoperably high transistor threshold voltage under its normal operating conditions, thereby rendering the transistor segment over the implant region 603 inoperable.

It should be understood that thermal fabrication processes performed subsequent to formation of the implant region 603 are of sufficiently low temperature and short duration so as to anneal dopants within the implant region 603 without causing significant diffusion of the dopants within the implant region 603 from their implanted locations. Therefore, a boundary 603A of the originally-formed implant region 603 will be maintained during subsequent fabrication processes without significant distortion. Consequently, the boundary 603A of the implant region 603 can be used as a reliable transition boundary between an operable transistor threshold voltage (associated with the diffusion region 601 outside of the implant region 603) and an inoperable transistor threshold voltage (within the implant region 603).

FIG. 6 shows a gate electrode 609 defined to extend over both the diffusion region 601 and the implant region 603. A first portion of the gate electrode 609 defined over the diffusion region 601 forms a first transistor segment 609A having the operable transistor threshold voltage of the diffusion region 601, specifically of the source/drain regions 601B-610C. A second portion of the gate electrode 609 defined over the implant region 603 forms a second transistor segment 609B having the inoperably high transistor threshold voltage of the implant region 603. While the gate electrode 609 is continuously defined over both the diffusion region 601 and the implant region 603, under normal operating conditions (i.e., normal gate electrode 609 voltage levels) the first transistor segment 609A will be operable, but the second transistor segment 609B will be inoperable. Therefore, an effective diffusion region is defined by a portion of the original diffusion region 601 that exists outside of the implant region 603. The effective diffusion region is the portion of the original diffusion region 601 that provides the operable transistor threshold voltage for transistors defined thereover under normal operating conditions.

In view of the foregoing, it should be understood that the implant regions, such as implant region 603, can be used to modify diffusion region boundaries, and thereby modify transistor sizes. More specifically, a high transistor threshold voltage implant region can be used to control a channel width of a transistor, thereby alleviating problems associated with having to control the channel width of the transistor solely through diffusion region boundary locations, which are susceptible to lithography-induced distortion in the as-fabricated state. For example, FIG. 6 shows that the implant region 603 is positioned to define a channel width (W) of the transistor 609A. The boundary 603A of the implant region 603 that crosses the gate electrode 609 defines the extent of the transistor 609A, and thereby defines the channel width (W) of the transistor 609A. Therefore, in the example of FIG. 6, the boundary of the diffusion region 601 defines a first width boundary of the first transistor segment 609A, and the boundary 603A of the implant region 603 defines a second width boundary of the first transistor segment 609A, wherein a width of the first transistor segment 609A extends between the first and second width boundaries.

In one embodiment, such as that shown in FIG. 6, the implant region technique for controlling transistor channel width size is used in conjunction with linear-shaped gate electrode features that are defined to extend over the substrate in a single direction. However, it should be understood that the implant region technique for controlling transistor channel width size can also be used in conjunction with essentially any gate electrode shape. Additionally, in one embodiment, such as that of FIG. 6, the boundary of the implant region that crosses the gate electrode is oriented to be substantially parallel to a channel length of the first transistor segment. In this manner, the channel width of the transistor segment is substantially uniform across the channel length of the transistor segment. Uniformity in transistor channel width facilitates transistor performance prediction and optimization.

Figure 7:
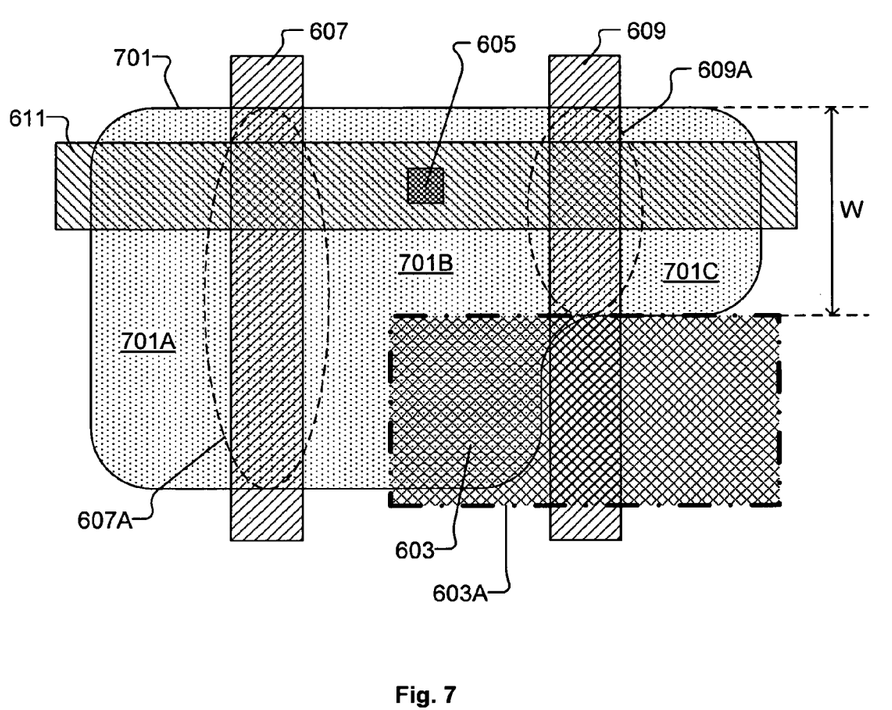
FIG. 7 is an illustration showing a variation of the transistor layout of FIG. 6, in accordance with one embodiment of the present invention.

FIG. 7 is an illustration showing a variation of the transistor layout of FIG. 6, in accordance with one embodiment of the present invention. Instead of the rectangular-shaped diffusion region 601 as shown in FIG. 6, the layout of FIG. 7 utilizes a non-rectangular-shaped diffusion region 701 in which source/drain regions 701A-701C are formed. It should be appreciated that prior to utilization of the implant region 603, the transistor segment 609A is defined to have a variable channel width across its channel length due to the lithography-induced curvature in the as-fabrication diffusion region 701. However, upon utilization of the implant region 603, the effective diffusion region 701 boundaries are modified to be coincident with the boundaries of the implant region 603, i.e., with the boundaries that exist between the original diffusion region 701 and the implant region 603. Therefore, the transistor segment 609A is defined to have the substantially uniform channel width (W) across its channel length. It should be understood that the implant region 603 size and shape can be defined as necessary to compensate for any misalignment between the diffusion region 701 and the implant region 603.

FIG. 7 also shows an exemplary contact 605 defined to connect the source/drain region 701B to a higher-level interconnect conductor 611. The source/drain region 701B defines a diffusion node that is shared by transistors 607A and 609A. It should be appreciated that use of the implant region 603 provides for channel width uniformity control of the transistor segment 609A without having to define the transistors 607A and 609A over physically separate diffusion regions while maintaining the shared diffusion node 701B.

Figure 8:
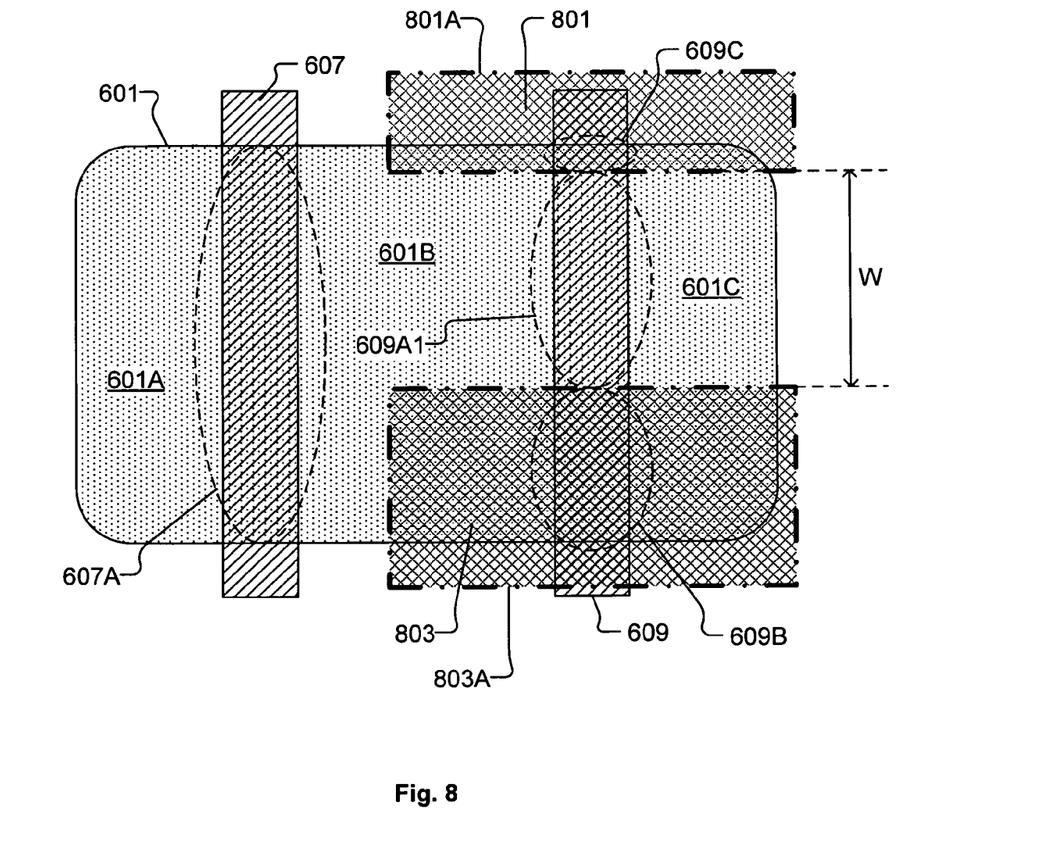
FIG. 8 shows a transistor layout in which a pair of implant regions are used together to define a transistor segment, in accordance with one embodiment of the present invention.

FIG. 8 shows a transistor layout in which a pair of implant regions are used together to define a transistor segment, in accordance with one embodiment of the present invention. As with the transistor layout of FIG. 6, the transistor layout of FIG. 8 includes the rectangular-shaped diffusion region 601. However, the exemplary embodiment of FIG. 8 includes a first implant region 803 having a boundary 803A, and a second implant region 801 having a boundary 801A. The first and second implant regions 803 and 801 are defined over the diffusion region 601 so as to cross the gate electrode 609. Each of the first and second implant regions 803 and 801 is defined to transform the operable transistor voltage of the diffusion region 601 into an inoperably high transistor threshold voltage. Therefore, the gate electrode 609 includes a first transistor segment 609A1 having the operable transistor threshold voltage of the diffusion region 601, a second transistor segment 609B1 having the inoperably high transistor threshold voltage of the implant region 803, and a third transistor segment 609C1 having the inoperably high transistor threshold voltage of the implant region 801. Therefore, the channel width (W) of the first transistor segment 609A1 is defined by the boundaries 703A and 701A of the implant regions 803 and 801, respectively.

Use of two implant regions to define opposing ends of a transistor segment, such as illustrated in FIG. 8, enables control of the transistor channel width (W) to be independently maintained within the implant region mask. More specifically, specification of first and second implant regions to define opposing ends of a transistor segment allows the channel width of the transistor segment to be controlled independently from a boundary of the diffusion region.

Figure 9:
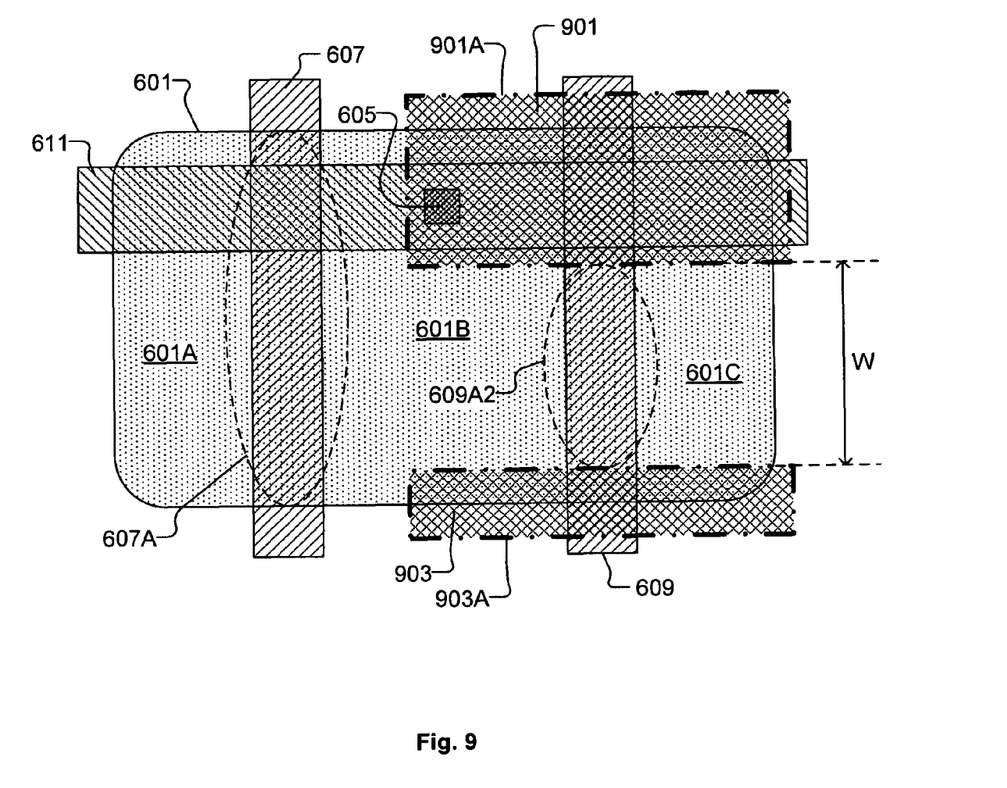
FIG. 9 shows another exemplary transistor layout in which a pair of implant regions are used together to define a transistor segment, in accordance with one embodiment of the present invention.

FIG. 9 shows another exemplary transistor layout in which a pair of implant regions are used together to define a transistor segment, in accordance with one embodiment of the present invention. A first implant region 903 having a boundary 903A, and a second implant region 901 having a boundary 901A are used to define the transistor segment 609A2. Therefore, the channel width (W) of the transistor segment 609A2 is defined by the boundaries 903A and 901A of the implant regions 903 and 901, respectively. FIG. 9 also shows the exemplary contact 605 defined to connect the source/drain region 601B to the higher-level interconnect conductor 611. The implant regions 903 and 901 are defined to shift the operable transistor segment 609A2 away from the contact 605, which may be improve a channel mobility of the transistor segment 609A2.

Figure 12:
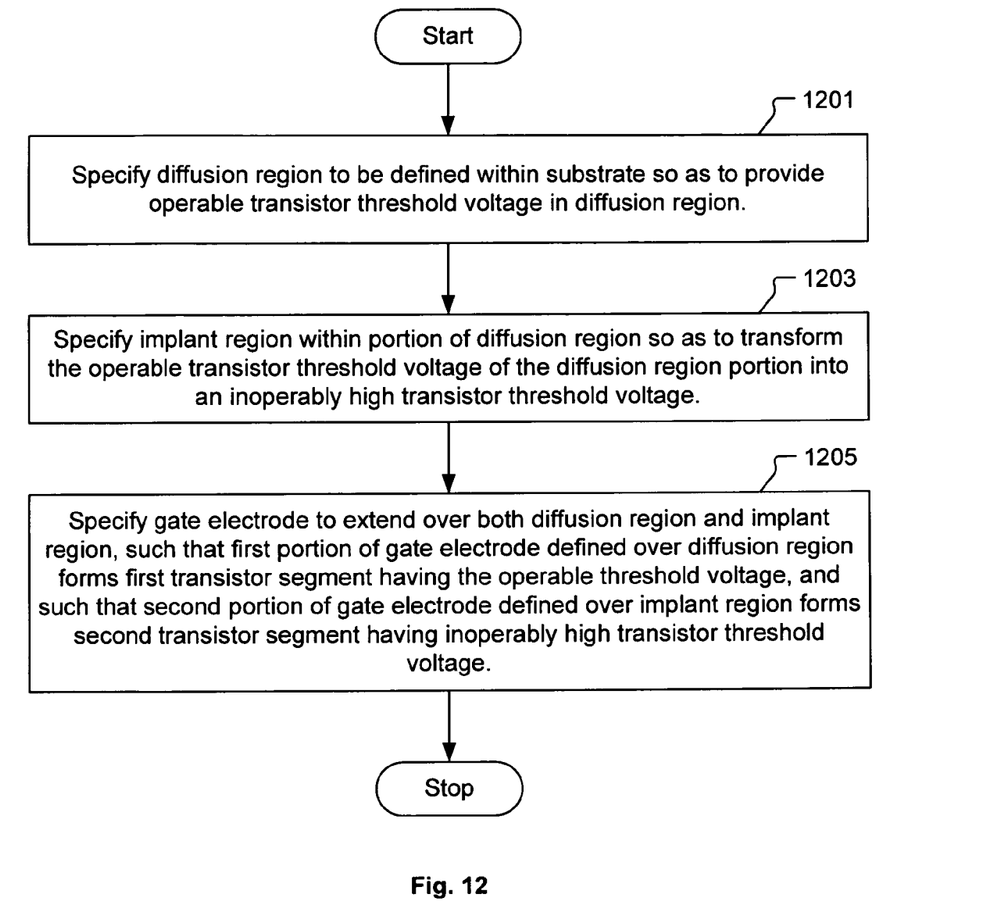
FIG. 12 shows a flowchart of a method for designing a transistor, in accordance with one embodiment of the present invention.

FIG. 12 shows a flowchart of a method for designing a transistor, in accordance with one embodiment of the present invention. The method includes an operation 1201 for specifying a diffusion region to be defined within a substrate so as to provide an operable transistor threshold voltage in the diffusion region. In one embodiment, the diffusion region is specified as a rectangular-shaped layout area. The method also includes an operation 1203 for specifying an implant region within a portion of the diffusion region so as to transform the operable transistor threshold voltage of the portion of the diffusion region into an inoperably high transistor threshold voltage.

The method further includes an operation 1205 for specifying a gate electrode to extend over both the diffusion region and the implant region. A first portion of the gate electrode defined over the diffusion region forms a first transistor segment having the operable threshold voltage. A second portion of the gate electrode defined over the implant region forms a second transistor segment having the inoperably high transistor threshold voltage. The operable transistor threshold voltage is defined to be exceeded when a normal operating voltage is applied to the gate electrode. The inoperably high transistor threshold voltage is defined to not be exceeded when the normal operating voltage is applied to the gate electrode.

It should be appreciated that the implant region is positioned to redefine one or more boundaries of the diffusion region. Also, the implant region is specified such that a boundary of the implant region is positioned to cross the gate electrode at a desired transistor width boundary location of the first transistor segment. In one embodiment, the implant region is positioned to eliminate misfabricated diffusion region boundaries.

In one embodiment, the implant region defined in operation 1203 represents a first implant region. In this embodiment, the method further includes an operation for specifying a second implant region within a second portion of the diffusion region, so as to transform the operable transistor threshold voltage of the second portion of the diffusion region into the inoperably high transistor threshold voltage. Also, in this embodiment, the gate electrode is specified to extend over both the first implant region, the diffusion region, and the second implant region, such that a third portion of the gate electrode defined over the second implant region forms a third transistor segment having the inoperably high transistor threshold voltage. A boundary of the first implant region defines a first width boundary of the first transistor segment. A boundary of the second implant region defines a second width boundary of the first transistor segment. Therefore, a width of the first transistor segment extends between the first and second width boundaries. It should be appreciated that specification of the first and second implant regions defines the width of the first transistor segment independently from a boundary of the diffusion region.

Figure 13:
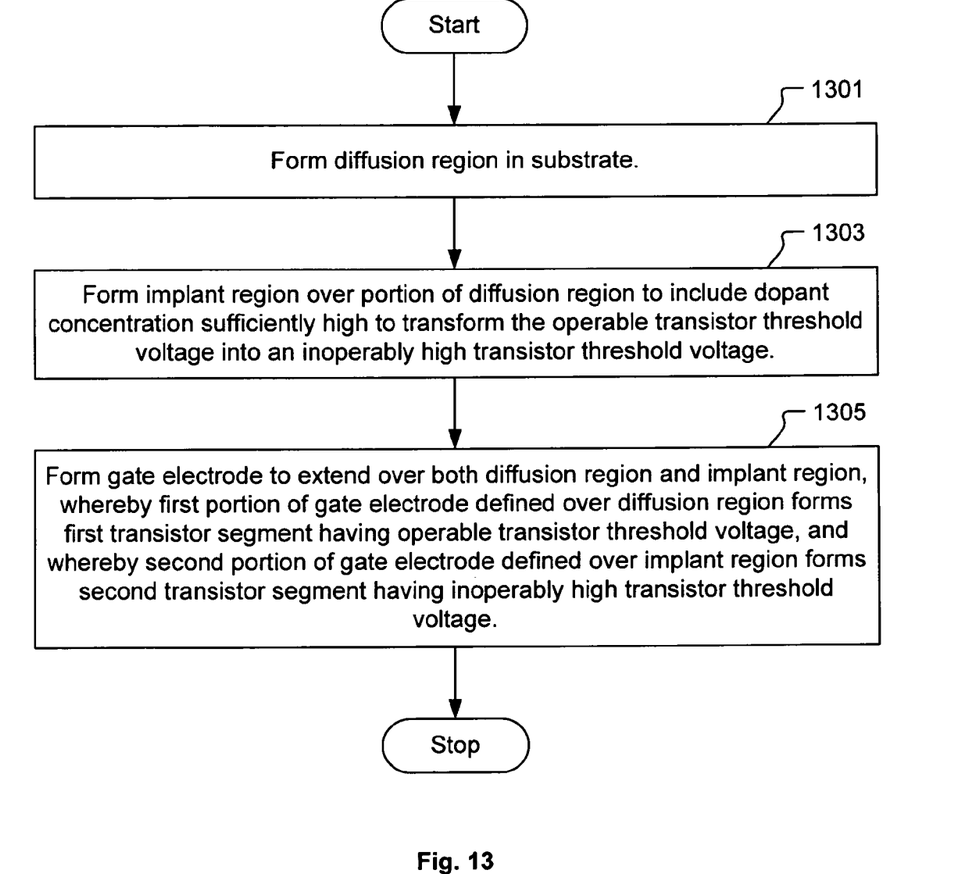
FIG. 13 shows a flowchart of a semiconductor fabrication process, in accordance with one embodiment of the present invention.

FIG. 13 shows a flowchart of a semiconductor fabrication process, in accordance with one embodiment of the present invention. The process includes an operation 1301 in which a diffusion region is formed within a substrate. The diffusion region is formed to provide an operable transistor threshold voltage. The process further includes an operation 1303 in which an implant region is formed over a portion of the diffusion region. The implant region includes a dopant concentration sufficiently high so as to transform the operable transistor threshold voltage of the diffusion region into an inoperably high transistor threshold voltage. In one embodiment, the implant region is formed to adjust a shape of the diffusion region, whereby only portions of the diffusion region outside the implant region provide the operable transistor threshold voltage.

Additionally, in an operation 1305, a gate electrode is formed to extend over both the diffusion region and the implant region. A first portion of the gate electrode is defined over the diffusion region to form a first transistor segment having the operable transistor threshold voltage associated with the diffusion region. A second portion of the gate electrode is defined over the implant region to form a second transistor segment having the inoperably high transistor threshold voltage. A normal operating voltage associated with the gate electrode is greater than the operable transistor threshold voltage provided by diffusion region and is less than the inoperably high transistor threshold voltage of the implant region. Therefore, the first transistor segment is operable and the second transistor segment is inoperable in exposure of the gate electrode to the normal operating voltage. In one embodiment, the implant region is formed such that a boundary of the implant region that crosses the gate electrode is oriented to be substantially parallel to a channel length of the first transistor segment.

In one embodiment, the diffusion region is formed in operation 1301 such that a boundary of the diffusion region defines a first width boundary of the first transistor segment. Then, in this embodiment, the implant region is formed in operation 1303 such that a boundary of the implant region defines a second width boundary of the first transistor segment. A width of the first transistor segment extends between the first and second width boundaries.

In one embodiment of the semiconductor fabrication process, the implant region represents a first implant region, and the process includes an operation to form a second implant region over a second portion of the diffusion region. The second implant region includes a dopant concentration sufficiently high so as to transform the operable transistor threshold voltage into an inoperably high transistor threshold voltage within the second implant region. In this embodiment, the gate electrode is formed to extend over the first implant region, the diffusion region, and the second implant region, such that a third portion of the gate electrode defined over the second implant region forms a third transistor segment having the inoperably high transistor threshold voltage. Also, a boundary of the first implant region defines a first width boundary of the first transistor segment, and a boundary of the second implant region defines a second width boundary of the first transistor segment. A width of the first transistor segment extends between the first and second width boundaries. In this embodiment, formation of the first and second implant regions defines a width of the first transistor segment independently from a boundary of the diffusion region.

It should be understood that the methods, designs, layouts, and structures as disclosed herein can be used as part of a process to design and fabricate a semiconductor chip. Also, it should be understood that methods, designs, layouts, and structures as disclosed herein, and can be stored in a digital format on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A transistor, comprising:
    a substrate portion;
    a diffusion region defined in the substrate portion to provide an operable transistor threshold voltage;
    an implant region defined within a portion of the diffusion region so as to transform the operable transistor threshold voltage of the portion of the diffusion region into an inoperably high transistor threshold voltage; and
    a gate electrode defined to extend over both the diffusion region and the implant region, such that a first portion of the gate electrode defined over the diffusion region forms a first transistor segment having the operable transistor threshold voltage, and such that a second portion of the gate electrode defined over the implant region forms a second transistor segment having the inoperably high transistor threshold voltage.

2. A transistor as recited in claim 1, wherein a normal operating voltage associated with the gate electrode is greater than the operable transistor threshold voltage of the diffusion region and is less than the inoperably high transistor threshold voltage of the implant region, such that the first transistor segment is operable and the second transistor segment is inoperable in exposure of the gate electrode to the normal operating voltage.

3. A transistor as recited in claim 1, wherein a boundary of the diffusion region defines a first width boundary of the first transistor segment, and wherein a boundary of the implant region defines a second width boundary of the first transistor segment, wherein a width of the first transistor segment extends between the first and second width boundaries.

4. A transistor as recited in claim 1, wherein the diffusion region is defined from a rectangular-shaped layout area.

5. A transistor as recited in claim 1, wherein the gate electrode is a linear-shaped gate electrode defined to extend over the substrate portion in a single direction.

6. A transistor as recited in claim 1, wherein a boundary of the implant region that crosses the gate electrode is oriented to be substantially parallel to a channel length of the first transistor segment.

7. A transistor as recited in claim 1, wherein the implant region is defined as a high voltage transistor implant region to provide a transistor threshold voltage of at least 2.5 volts, and wherein the operable transistor threshold voltage of the diffusion region is substantially less than 2.5 volts.

8. A transistor as recited in claim 1, wherein the implant region represents a first implant region, and further comprising:
    a second implant region defined within a second portion of the diffusion region so as to transform the operable transistor threshold voltage of the second portion of the diffusion region into the inoperably high transistor threshold voltage,
    wherein the gate electrode is defined to extend over the first implant region, the diffusion region, and the second implant region, such that a third portion of the gate electrode defined over the second implant region forms a third transistor segment having the inoperably high transistor threshold voltage, and wherein a boundary of the first implant region defines a first width boundary of the first transistor segment, and wherein a boundary of the second implant region defines a second width boundary of the first transistor segment, wherein a width of the first transistor segment extends between the first and second width boundaries.

9. A transistor as recited in claim 1, wherein the transistor is defined on a semiconductor chip.

10. A method for designing a transistor, comprising:
specifying a diffusion region to be defined within a substrate so as to provide an operable transistor threshold voltage in the diffusion region;
specifying an implant region within a portion of the diffusion region so as to transform the operable transistor threshold voltage of the portion of the diffusion region into an inoperably high transistor threshold voltage; and
specifying a gate electrode to extend over both the diffusion region and the implant region, such that a first portion of the gate electrode defined over the diffusion region forms a first transistor segment having the operable threshold voltage, and such that a second portion of the gate electrode defined over the implant region forms a second transistor segment having the inoperably high transistor threshold voltage.

11. A method for designing a transistor as recited in claim 10, wherein the implant region is specified such that a boundary of the implant region is positioned to cross the gate electrode at a desired transistor width boundary location of the first transistor segment.

12. A method for designing a transistor as recited in claim 10, wherein the operable transistor threshold voltage is defined to be exceeded when a normal operating voltage is applied to the gate electrode, and wherein the inoperably high transistor threshold voltage is defined to not be exceeded when the normal operating voltage is applied to the gate electrode.

13. A method for designing a transistor as recited in claim 10, wherein the diffusion region is specified as a rectangular-shaped layout area.

14. A method for designing a transistor as recited in claim 10, wherein the implant region is positioned to redefine one or more boundaries of the diffusion region.

15. A method for designing a transistor as recited in claim 10, wherein the implant region is positioned to eliminate misfabricated diffusion region boundaries.

16. A method for designing a transistor as recited in claim 10, wherein the implant region represents a first implant region, and further comprising:
specifying a second implant region within a second portion of the diffusion region so as to transform the operable transistor threshold voltage of the second portion of the diffusion region into the inoperably high transistor threshold voltage,
wherein the gate electrode is specified to extend over both the first implant region, the diffusion region, and the second implant region, such that a third portion of the gate electrode defined over the second implant region forms a third transistor segment having the inoperably high transistor threshold voltage, and
wherein a boundary of the first implant region defines a first width boundary of the first transistor segment, and wherein a boundary of the second implant region defines a second width boundary of the first transistor segment, wherein a width of the first transistor segment extends between the first and second width boundaries.

17. A method for designing a transistor as recited in claim 16, wherein specification of the first and second implant regions defines the width of the first transistor segment independently from a boundary of the diffusion region.

18. A semiconductor fabrication process, comprising:
forming a diffusion region in a substrate so as to provide an operable transistor threshold voltage;
forming an implant region over a portion of the diffusion region, wherein the implant region includes a dopant concentration sufficiently high so as to transform the operable transistor threshold voltage of the portion of the diffusion region into an inoperably high transistor threshold voltage; and
forming a gate electrode to extend over both the diffusion region and the implant region, whereby a first portion of the gate electrode defined over the diffusion region forms a first transistor segment having the operable transistor threshold voltage, and whereby a second portion of the gate electrode defined over the implant region forms a second transistor segment having the inoperably high transistor threshold voltage.

19. A semiconductor fabrication process as recited in claim 18, wherein a normal operating voltage associated with the gate electrode is greater than the operable transistor threshold voltage provided by the diffusion region and is less than the inoperably high transistor threshold voltage of the implant region, such that the first transistor segment is operable and the second transistor segment is inoperable in exposure of the gate electrode to the normal operating voltage.

20. A semiconductor fabrication process as recited in claim 18, wherein the diffusion region is formed such that a boundary of the diffusion region defines a first width boundary of the first transistor segment, and wherein the implant region is formed such that a boundary of the implant region defines a second width boundary of the first transistor segment, wherein a width of the first transistor segment extends between the first and second width boundaries.

21. A semiconductor fabrication process as recited in claim 18, wherein the diffusion region is formed based on a rectangular-shaped diffusion region layout.

22. A semiconductor fabrication process as recited in claim 18, wherein the gate electrode is a linear-shaped gate electrode defined to extend over the substrate portion in a single direction.

23. A semiconductor fabrication process as recited in claim 18, wherein the implant region is formed such that a boundary of the implant region that crosses the gate electrode is oriented to be substantially parallel to a channel length of the first transistor segment.

24. A semiconductor fabrication process as recited in claim 18, wherein the implant region is formed to adjust a shape of the diffusion region, whereby only portions of the diffusion region outside the implant region provide the operable transistor threshold voltage.

25. A semiconductor fabrication process as recited in claim 18, wherein the implant region represents a first implant region, and further comprising:
forming a second implant region over a second portion of the diffusion region, wherein the second implant region includes a dopant concentration sufficiently high so as to transform the operable transistor threshold voltage into an inoperably high transistor threshold voltage within the second implant region,
wherein the gate electrode is formed to extend over the first implant region, the diffusion region, and the second implant region, such that a third portion of the gate electrode defined over the second implant region forms a third transistor segment having the inoperably high transistor threshold voltage, and wherein a boundary of the first implant region defines a first width boundary of the first transistor segment, and wherein a boundary of the second implant region defines a second width boundary of the first transistor segment, wherein a width of the first transistor segment extends between the first and second width boundaries.

26. A semiconductor fabrication process as recited in claim 25, wherein formation of the first and second implant regions defines a width of the first transistor segment independently from a boundary of the diffusion region.

* * * * *